(12) United States Patent
Yamada et al.

(10) Patent No.: US 7,511,314 B2
(45) Date of Patent: Mar. 31, 2009

(54) LIGHT EMITTING DEVICE AND METHOD OF FABRICATING THE SAME

(75) Inventors: Masato Yamada, Annaka (JP); Masayuki Shinohara, Annaka (JP); Masanobu Takahashi, Annaka (JP); Keizou Adomi, Annaka (JP); Jun Ikeda, Annaka (JP)

(73) Assignee: Shin-Etsu Handotai Co., Ltd., Toyko (JP)

( * ) Notice: Subject to any disclaimer, the term of this patent is extended or adjusted under 35 U.S.C. 154(b) by 185 days.

(21) Appl. No.: 10/575,853

(22) PCT Filed: Oct. 15, 2004

(86) PCT No.: PCT/JP2004/015270

§ 371 (c)(1),
(2), (4) Date: Apr. 14, 2006

(87) PCT Pub. No.: WO2005/038936

PCT Pub. Date: Apr. 28, 2005

(65) Prior Publication Data

US 2007/0145405 A1  Jun. 28, 2007

(30) Foreign Application Priority Data

Oct. 16, 2003  (JP)  ............................. 2003-356955

(51) Int. Cl.
*H01L 29/26* (2006.01)

(52) U.S. Cl. .................. 257/101; 257/86; 257/98; 257/102; 257/103; 257/E33.001; 438/22; 438/37; 438/936

(58) Field of Classification Search ............... 257/79, 257/86, 98, 101, 102, 103, 96, E33.001; 438/22, 438/37, 936

See application file for complete search history.

(56) References Cited

U.S. PATENT DOCUMENTS

| 4,100,014 A | * | 7/1978 | Kuhn-Kuhnenfeld et al. .................... 438/745 |
| 6,107,648 A | * | 8/2000 | Shakuda et al. ............. 257/103 |

FOREIGN PATENT DOCUMENTS

EP  0316377 A2  9/1994

(Continued)

OTHER PUBLICATIONS

IDS Reference, Huang et al., "Twofold efficiency improvement in high performance AlGaInP light-emitting diodes in the 555-620 nm spectral region using a thick GaP window layer", Applied Physics Letters—Aug. 31, 1992—vol. 61, Issue 9, pp. 1045-1047.*

(Continued)

*Primary Examiner*—Evan Pert
*Assistant Examiner*—Scott R Wilson
(74) *Attorney, Agent, or Firm*—Oliff & Berridge, PLC

(57) ABSTRACT

Disclosed is a light-emitting device (100) has a light-emitting layer portion (24) which is composed of a group III-V compound semiconductor and a transparent thick-film semiconductor layer (90) with a thickness of not less than 40 μm which is formed on at least one major surface side of the light-emitting layer portion (24) and composed of a group III-V compound semiconductor having a band gap energy larger than the photon energy equivalent of the peak wavelength of emission flux from the light-emitting layer portion (24). The transparent thick-film semiconductor layer (90) has a lateral surface portion (90S) which is a chemically etched surface. The dopant concentration of the transparent thick-film semiconductor layer (90) is not less than $5 \times 10^{16}/cm^3$ and not more than $2 \times 10^{18}/cm^3$. The light-emitting device can have a transparent thick-film semiconductor layer while being significantly improved in light taking-out efficiency from the lateral surface portion.

16 Claims, 9 Drawing Sheets

FOREIGN PATENT DOCUMENTS

| | | |
|---|---|---|
| JP | 4-354382 | 12/1992 |
| JP | 6-296040 | 10/1994 |
| JP | A-6-326360 | 11/1994 |
| JP | 10-65210 | 3/1998 |
| JP | A-2001-15803 | 1/2001 |
| JP | 2001-68731 | 3/2001 |
| JP | 2002-237617 | 8/2002 |

OTHER PUBLICATIONS

IDS Reference, Huang et al., "Twofold efficiency improvement in high performance AlGaInP light-emitting diodes in the 555-620 nm spectral region using a thick GaP window layer", Applied Physics Letters—Aug. 31, 1992—vol. 61, Issue 9, pp. 1045-1047.*

Kish, F.A., et al., "Very high-efficiency semiconductor wafer-bonded transparent-substrate($Al_xGa_{1-x})_{0.5}In_{0.5}P$/GaP light-emitting diodes," *Applied Physics Letters*, 1964, Abstract (vol. 64, pp. 2839-2841).

Huang, K.H. et al., "Twofold efficiency improvement in high performance AlGaInP light-emitting diodes in 555-620 nm spectral region using a thick GaP window layer," *Applied Physics Letters*, 1992, Abstract (vol. 61, pp. 1045-1047).

Huang et al., "Twofold efficiency improvement in high performance AlGaInP light-emitting diodes in the 555-620 nm spectral region using a thick GaP window layer," Appl. Phys. Lett., vol. 61, No. 9, pp. 1045-1047, Aug. 1992.

* cited by examiner

FIG.2
STEP 1
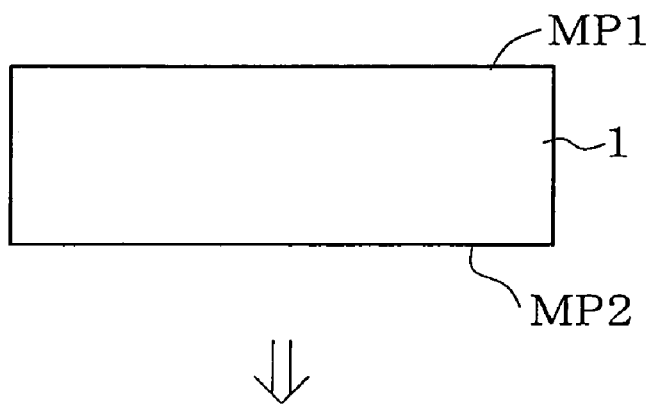
STEP 2
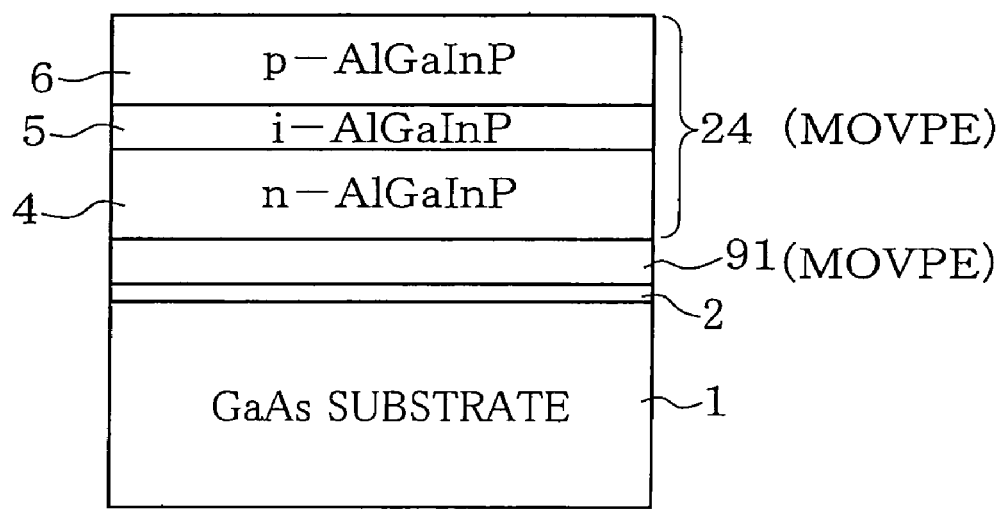

FIG.3
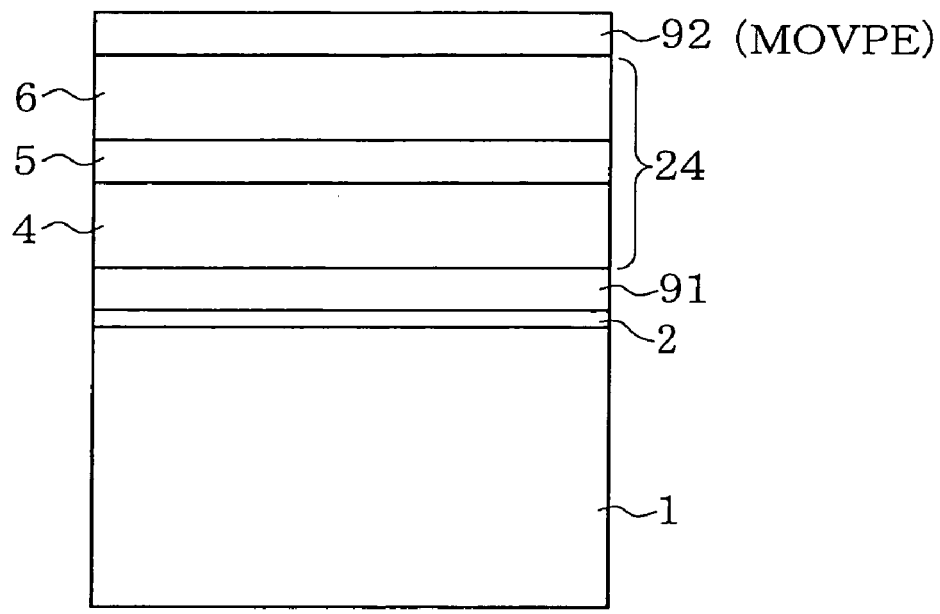
STEP 3
STEP 4
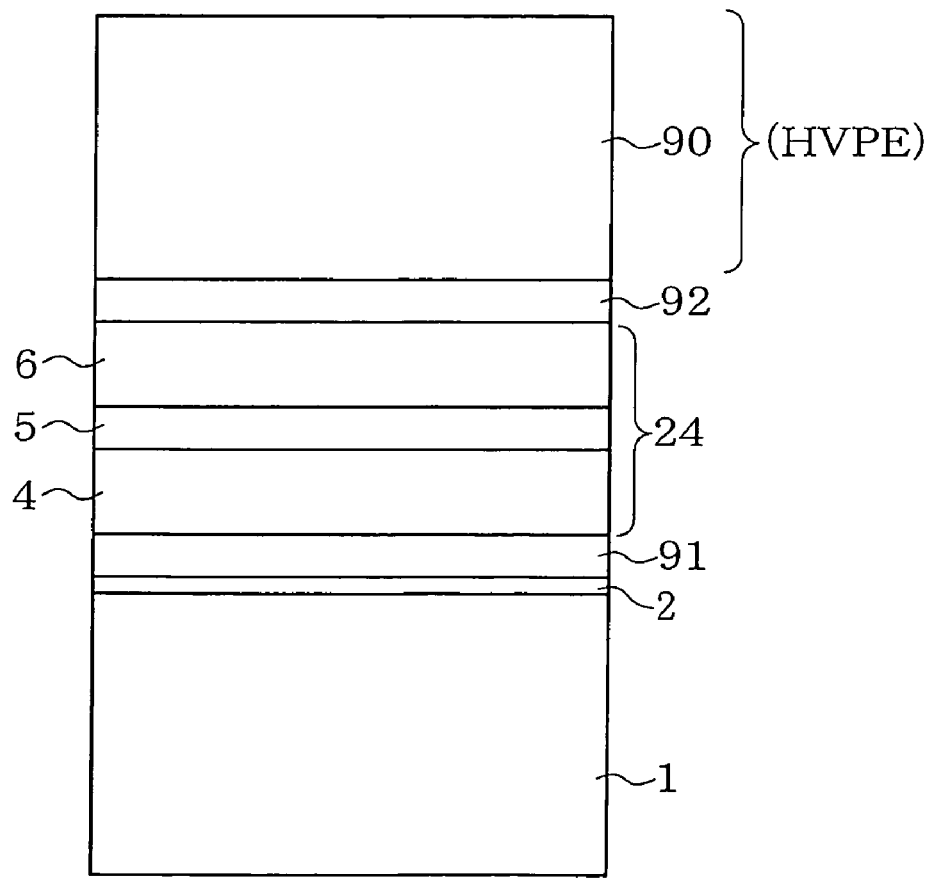

FIG.4
STEP 5
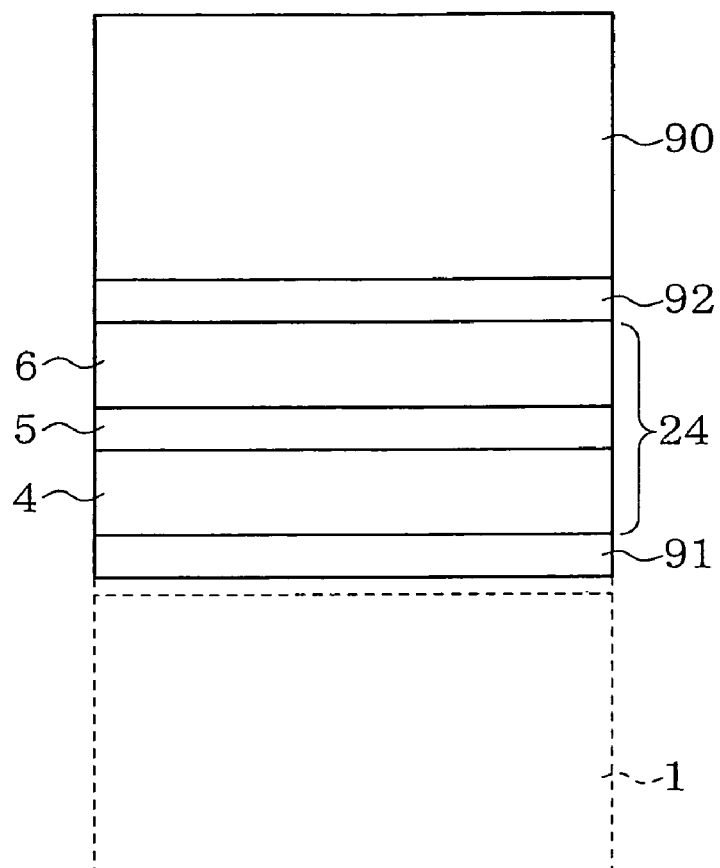
STEP 6
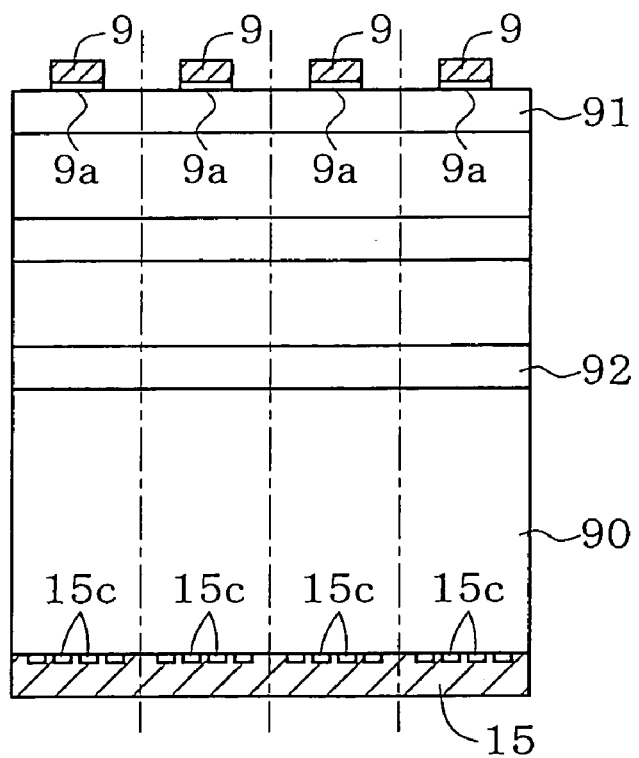

LIGHT EMITTING DEVICE AND METHOD OF FABRICATING THE SAME

BACKGROUND OF THE INVENTION

1. Field of the Invention

This invention relates to a light emitting device and a method of fabricating the same.

2. Description of the Related Art

Light emitting device having the light emitting layer portion thereof composed of an $(Al_xGa_{1-x})_yIn_{1-y}P$ alloy (where, $0 \leq x \leq 1$, $0 \leq y \leq 1$; simply referred to as AlGaInP alloy, or more simply as AlGaInP, hereinafter) can be realized as a high-luminance device, by adopting a double heterostructure in which a thin AlGaInP active layer is sandwiched between an n-type AlGaInP cladding layer and a p-type AlGaInP cladding layer, both having a larger band gap. Current is supplied to the light emitting layer portion through a metal electrode formed on the surface of the device. The metal electrode acts as a light interceptor, so that it is formed, for example, so as to cover only the center portion of a first main surface of the light emitting layer portion, to thereby allow light to be extracted from the peripheral region having no electrode formed thereon.

In this case, smaller area of the metal electrode is advantageous in terms of improving the light extraction efficiency, because it can ensure larger area for the light leakage region formed around the electrode. Conventional efforts have been made on increase in the energy of light extraction by effectively spreading current within the device through consideration on planary shape of the electrode, but increase in the electrode area is inevitable anyhow in this case, having been fallen in a dilemma that a smaller light extraction area results in a limited amount of energy of light extraction. Another problem resides in that the current is less likely to spread in the in-plane direction, because the dopant carrier concentration, and consequently the conductivity, of the cladding layer is suppressed to a slightly lower level in order to optimize emissive recombination of carriers in the active layer. This concentrates the current into the region covered by the electrode, and results in decreasing an amount of the substantial light extraction energy from the light leakage region. There has been adopted a method of forming, between the cladding layer and the electrode, a low-resistivity current spreading layer having a dopant concentration larger than that of the cladding layer. On the other hand, there is also proposed a configuration in which a thick and low-resistivity transparent semiconductor layer is disposed on the back surface side of the device, typically by bonding a semiconductor single crystal substrate, so as to use the layer also as the device substrate (Japanese Laid-Open Patent Publication "Tokkai" No. 2001-68731). In both of these cases, provision of the current spreading layer or the transparent semiconductor layer as a transparent thick-film semiconductor layer thickened to a certain degree or more makes it possible not only to improve the current spreading effect in the device plane, but also to further increase the light extraction efficiency because the extracted light energy from the side face portions of the layer can be increased.

In fabrication of the light emitting device having the transparent thick-film semiconductor layer as described in the above, it is general to adopt a method of preparing a wafer having such transparent thick-film semiconductor layer formed thereon, and dicing the wafer to thereby divide it into the individual device chips. In the process of dicing, the side face portions of each device as cutting surfaces, have a process-damaged layer formed therein, and a large number of crystal defects contained in the process-damaged layer are causative of current leakage and scattering, so that it is a general practice to remove, after the dicing, the process-damaged layer by chemical etching.

The removal of the process-damaged layer by any publicly-known chemical etching, however, cannot always be judged by leakage current, because the light emitting layer portion and the transparent thick-film semiconductor layer differ in the chemical composition from each other, and this has been consequently resulting in only an insufficient improvement in the light extraction efficiency from the side face portions of these layers. A method relying upon an excessively strong chemical etching, in view of raising the etching effect of the side face portions, is not adoptable because it may result in roughening of the main surface of the device or in damage of the metal electrodes already formed thereon, and may degrade performances of the device.

It is therefore a subject of this invention to provide a light emitting device having the transparent thick-film semiconductor layer and capable of distinctively raising the light extraction efficiency from the side face portions of the layer, and a method of fabricating such device.

SUMMARY OF THE INVENTION

Aiming at solving the above-described subject, a light emitting device of this invention is such as having a light emitting layer portion composed of a III-V compound semiconductor; and a transparent thick-film semiconductor layer having a thickness of 10 µm or more, formed on at least one main surface of the light emitting layer portion, and composed of a III-V compound semiconductor having a band gap energy larger than a light quantum energy which corresponds to a peak wavelength of emission flux from the light emitting layer portion, the transparent thick-film semiconductor layer has the side face portions configured as chemically-etched surfaces, and has a doping-controlled region having a controlled dopant concentration of $5 \times 10^{16}/cm^3$ to $2 \times 10^{18}/cm^3$, both ends inclusive, formed therein to a thickness of 10 µm or more.

A method of fabricating a light emitting device of this invention has steps of fabricating a wafer which comprises a light emitting layer portion composed of a III-V compound semiconductor; and a transparent thick-film semiconductor layer having a thickness of 10 µm or more, formed on at least one main surface of the light emitting layer portion, and composed of a III-V compound semiconductor having a band gap energy larger than a light quantum energy which corresponds to a peak wavelength of emission flux from the light emitting layer portion; and dicing the wafer to divide it into the individual device chips; also forming, in the transparent thick-film semiconductor layer, a doping-controlled region having a controlled dopant concentration of $5 \times 10^{16}/cm^3$ to $2 \times 10^{18}/cm^3$, both ends inclusive, to a thickness of 10 µm or more, and removing a process-damaged layer, formed on the side face portions of the transparent thick-film semiconductor layer, by chemical etching after the dicing.

In the light emitting device of this invention, the thickness of the transparent thick-film semiconductor layer is limited to 10 µm or more, because it is intended to increase the luminance (integrating sphere luminance) of the entire light emitting device, by increasing the flux extractable from the side faces of the transparent thick-film semiconductor layer when the emission flux is extracted from the light emitting layer portion through that layer. The transparent thick-film semiconductor layer is composed of a III-V compound semiconductor having a band gap energy larger than a light quantum energy which corresponds to a peak wavelength of emission flux from the light emitting layer portion, because it is intended to suppress light absorption by such transparent thick-film semiconductor layer, and to increase the light extraction efficiency. The thickness of the transparent thick-film semiconductor layer is preferably 40 µm or more.

The inventors found out from their investigations that, in the process of forming the above-described transparent thick-film semiconductor layer, formation of a doping-controlled region having a controlled dopant concentration of $5 \times 10^{16}/\text{cm}^3$ to $2 \times 10^{18}/\text{cm}^3$, both ends inclusive, in the transparent thick-film semiconductor layer made it possible to distinctively increase the light extraction efficiency from the side face portions of the doping-controlled region after the chemical etching, and to considerably increase the integrating sphere luminance of the light emitting device. There is no particular upper limitation on the thickness of the transparent thick-film semiconductor layer, but the upper limit of the thickness is preferably adjusted to 200 µm (more preferably 100 µm), considering saturation of the light extraction efficiency from the side faces and production efficiency (especially for the case where the transparent thick-film semiconductor layer is formed by vapor phase growth, rather than bonding of a single crystal substrate).

In the process of fabricating the light emitting device as described in the above, a wafer having the transparent thick-film semiconductor layer and the light emitting layer portion is prepared, and the wafer is then diced so as to divide the individual device chips. In the dicing, cutting surfaces appear on the side faces of the transparent thick-film semiconductor layer, and the process-damaged layer having a predetermined thickness is formed therein. For the light extraction, a large number of crystal defects contained in the process-damaged layer are causative of current leakage and scattering, so that it is necessary to remove, after the dicing, the process-damaged layer by chemical etching.

In this invention, the doping-controlled region having a controlled dopant concentration of $5 \times 10^{16}/\text{cm}^3$ to $2 \times 10^{18}/\text{cm}^3$, both ends inclusive, is formed in the transparent thick-film semiconductor layer, to a thickness of at least 10 µm or more. The doping-controlled region, having the dopant concentration suppressed to as low as $2 \times 10^{18}/\text{cm}^3$, allows a smooth and thorough removal of the process-damaged layer, without needing an excessive chemical etching. In other words, the process-damaged layer can thoroughly be removed without degrading device portions other than the damaged layer (for example, metal electrodes on the light extraction surface side, and the surficial portion of semiconductor therearound), and it is consequently considered that the integrating sphere luminance dramatically increases after the etching, and that an extra-high-quality light emitting device is realized. This effect becomes more distinctive as the thickness of the doping-controlled region increases, and more specifically, the thickness of the doping-controlled region is preferably 40 µm or more. The transparent thick-film semiconductor layer may be composed of the doping-controlled region over the entire thickness thereof, or only over a partial thickness. However in view of improving the light extraction efficiency of the entire device, it is preferable that a possibly-largest partial thickness of the transparent thick-film semiconductor layer is partially occupied by the doping-controlled region having a desirable light extraction efficiency from the side face portions, and it is preferable, for example, that 50% or more of the thickness of the transparent thick-film semiconductor layer serves as the doping-controlled region. Considering the above, it can be said, in view of raising the light extraction efficiency from the side faces of the transparent thick-film semiconductor layer, that the transparent thick-film semiconductor layer preferably has a thickness of 40 µm or more, and more preferably that the transparent thick-film semiconductor layer has the doping-controlled region formed therein to a thickness of 40 µm or more.

For the case where the transparent thick-film semiconductor layer is composed of any one of GaP, GaAsP and AlGaAs as described later, use of an aqueous sulfuric acid/hydrogen peroxide solution as an etchant for the chemical etching can yield an especially distinctive effect of removal of the damaged layer, can consequently yield an effect of improving the integrating sphere luminance, and is effective in this invention.

The dopant concentration in the doping-controlled region in the transparent thick-film semiconductor layer, suppressed to a low level, may slightly increase the electric resistivity in some degree, but formation thereof as thick as 10 µm or more in view of improving the light extraction efficiency from the side faces makes it possible to ensure a sufficiently low sheet resistance despite a low dopant concentration, and makes it possible to readily achieve a current spreading effect comparative to that attained by a heavily-doped semiconductor. It is, however, to be noted that the dopant concentration of less than $5 \times 10^{16}/\text{cm}^3$ inevitably increases the sheet resistance, results in an insufficient current spreading effect when the light emitting layer portion is supplied with current, and results in a lowered integrating sphere luminance. It is therefore preferable to set the dopant concentration of the doping-controlled region to $5 \times 10^{16}/\text{cm}^3$ to $2 \times 10^{18}/\text{cm}^3$, both ends inclusive, and more preferably to $1 \times 10^{17}/\text{cm}^3$ to $1 \times 10^{18}/\text{cm}^3$, both ends inclusive.

The light emitting device of this invention can be configured so that the light emitting layer portion, considered as having one of two main surfaces thereof as a first main surface, has a main light extraction surface formed on the first main surface side thereof, a light-extraction-surface-side metal electrode is disposed on the main light extraction surface so as to cover a part thereof, and the transparent thick-film semiconductor layer is provided only on the second main surface side of the light emitting layer portion. Provision of the transparent thick-film semiconductor layer only on the second main surface side of the light emitting layer portion makes it possible to reduce the thickness of the entire light emitting device. This makes it possible to enhance radiation in the thickness-wise direction of Joule heat energy under current supply to the device for light emission, and consequently to expand the device life. Provision of the transparent thick-film semiconductor layer only on one surface of the light emitting layer portion contributes also to cost reduction in the device fabrication. In particular in high-luminance display devices (those for use in traffic signals or large-sized-screen displays, for example) or large-current surface emission devices such as illumination devices, reduction in the device thickness increases a distinctive effect on improving the heat radiation and reducing the cost. It is to be noted that the "light extraction surface" refers herein to a device surface through which the emission flux can be extracted to the external, and the "main light extraction surface" refers to such light extraction surface formed on the main surface of the device stack containing the light emitting layer portion. Besides the main light extraction surface, the side faces of the transparent thick-film semiconductor layer, for example, configure the light extraction surface. In this patent specification, for the case where the light emitting layer portion uses only one main surface, out of two surfaces thereof, as the light extraction surface, the term "first main surface" is always used to express the surface, which serves as the light extraction surface.

The configuration providing the transparent thick-film semiconductor layer only on the second main surface side of the light emitting layer portion may distinctively contribute to improvement in the heat radiation of the device, whereas the thickness of the semiconductor layer on the first main surface side (main light extraction surface side) inevitably is decreased. It is therefore made possible, by adopting embodiments described below, to ensure a desirable state of current spreading on the main light extraction surface side, and consequently to ensure a uniform emission operation of the light emitting layer portion in the main light extraction surface region to thereby further improve the integrating sphere luminance.

(1) A current spreading layer thinner than the transparent thick-film semiconductor layer on the second main surface side is formed on a first-conductivity-type cladding layer, using a compound semiconductor which has a composition different from that of the first-conductivity-type cladding layer. The current spreading effect can be made more distinctive, by raising the effective carrier concentration of in the current spreading layer than in the first-conductivity-type cladding layer.

(2) The first-conductivity-type cladding layer is formed so as to be thicker than a second-conductivity-type cladding layer and thinner than the transparent thick-film semiconductor layer. In this case, it is also possible to understand that the portion of the first main surface side on the first-conductivity-type cladding layer serves as the current spreading layer, so that the current spreading effect can be made more distinctive by raising the effective carrier concentration in that portion higher than the rest.

Next, it is also allowable to dispose the transparent thick-film semiconductor layer on the first main surface side of the light emitting layer portion, and to dispose, while assuming the first main surface of the transparent thick-film semiconductor layer as the main light extraction surface, the light-extraction-surface-side metal electrode so as to cover a part thereof. This configuration makes it possible to considerably increase the current spreading effect on the main light extraction surface side, by virtue of the transparent thick-film semiconductor layer. In this case, a metal reflective layer can be disposed on the second main surface side of the light emitting layer portion. By reflecting the emission flux from the light emitting layer portion back to the main light extraction surface side using the metal reflective layer, it is made possible to increase flux extractable from the main light extraction surface or from the side faces of the transparent thick-film semiconductor layer composing the main light extraction surface, and to thereby realize an extra-high-luminance light emitting device having a large directivity on the main light extraction surface side. On the other hand, it is also allowable to respectively dispose, as the transparent thick-film semiconductor layer, a first transparent thick-film semiconductor layer on the first main surface side of the light emitting layer portion, and a second transparent thick-film semiconductor layer on the second main surface side of the same. This makes it possible to further improve the light extraction efficiency from the side faces and the current spreading effect, by virtue of provision of two transparent thick-film semiconductor layers unique to this invention, and to thereby further increase the integrating sphere luminance of the device.

The light emitting layer portion can be configured as having a double heterostructure composed of AlGaInP. AlGaInP refers to an $(Al_xGa_{1-x})_yIn_{1-y}P$ alloy ($0 \leq x \leq 1$, $0 < y \leq 1$) which can epitaxially be grown on a GaAs single crystal substrate, and it is to be defined herein that any possible compositions, even when having not all of three Group III elements contained therein as a result of selection of alloy compositions x and y, are generally expressed as "AlGaInP" (the expression, therefore, not always means the composition containing all of three Group III elements of Al, Ga and In). The emission wavelength can be easily adjusted typically within the range from 520 nm to 670 nm, both ends inclusive, while maintaining the lattice constants capable of ensuring lattice matching with the GaAs single crystal substrate, and also maintaining a high emission intensity, through adjustment of x and y of the AlGaInP alloyed compound. In this case, GaP or GaAsP, relatively wide in the band gap, has a desirable transmissivity for the flux emitted from the AlGaInP-based light emitting layer portion, and this makes it possible to increase the light extraction efficiency.

The transparent thick-film semiconductor layer may be a single crystal substrate composed of a III-V compound semiconductor bonded to the light emitting layer portion. For an exemplary case where the light emitting layer portion is composed of AlGaInP, it is made possible to directly bond the single crystal substrate to the light emitting layer portion, by stacking the single crystal substrate composed of GaP, GaAsP or AlGaAs with the light emitting layer portion, and then subjecting the stack to annealing for bonding at a relatively low temperature from 100° C. to 700° C., both ends inclusive, to thereby easily form the transparent thick-film semiconductor layer.

On the other hand, the transparent thick-film semiconductor layer can also be configured as being epitaxially grown on the light emitting layer portion by the hydride vapor phase epitaxial growth method (also referred to as the HVPE method, hereinafter). The HVPE method is a method such as converting Ga (gallium), having a low vaporizing pressure, into more vaporizable GaCl through reaction with hydrogen chloride, and allowing Ga to react with a Group V element source gas through the GaCl as a medium, so as to epitaxially grow a III-V compound semiconductor layer. For example, the light emitting layer portion composed of AlGaInP is generally formed by the metal organic vapor phase epitaxy method (also referred to as the MOVPE method, hereinafter), showing a layer growth rate of only as small as approximately 4 µm/hour or around, which could be appropriate for growth of a thin light emitting layer portion, but apparently disadvantageous for growth of a thick light emitting layer portion having a thickness of over 40 µm in terms of the process efficiency. In contrast to this, the growth rate of layers in the HVPE method is, for example approximately 9 µm/hour, which is more than twice larger than that in the MOVPE method, proving that the HVPE method can obtain a growth rate of layer larger than in the MOVPE method, so that the transparent thick-film semiconductor layer can be formed in an extremely efficient manner, and cost for the source materials can be suppressed to a far lower level than in the MOVPE method because there is no need of using any expensive organic metals.

BRIEF DESCRIPTION OF THE DRAWINGS

FIG. 2 is a schematic drawing showing process steps of fabricating the light emitting device shown in FIG. 1;

FIG. 3 is a drawing as continued from FIG. 2;

FIG. 4 is a drawing as continued from FIG. 3;

BEST MODES FOR CARRYING OUT THE INVENTION

Best modes for carrying out this invention will be described below referring to the attached drawings.

Figure 1:
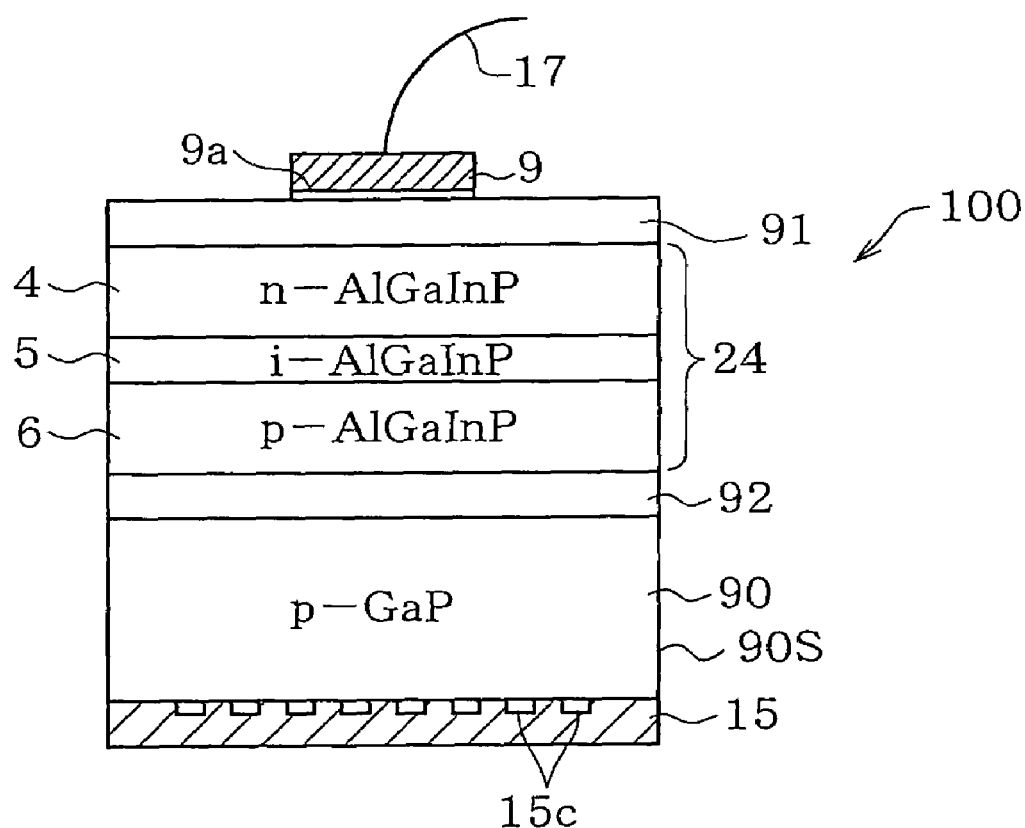
FIG. 1 is a schematic drawing showing a stack structure of an exemplary light emitting device of this invention.

FIG. 1 is a conceptual drawing of a light emitting device 100 as one embodiment of this invention. The light emitting device 100 has a light emitting layer portion 24 composed of a III-V compound semiconductor; and a transparent thick-film semiconductor layer 90 formed on the second main surface side of the light emitting layer portion 24, and composed of a III-V compound semiconductor having a band gap energy larger than a light quantum energy which corresponds to a peak wavelength of emission flux from the light emitting layer portion 24.

The light emitting layer portion 24 has a structure in which an active layer 5 composed of a non-doped $(Al_xGa_{1-x})_yIn_{1-y}P$ alloy (where, $0 \leq x \leq 0.55$, $0.45 \leq y \leq 0.55$) is held between a p-type cladding layer 6 composed of a p-type $(Al_zGa_{1-z})_yIn_{1-y}P$ alloy (where, $x < z \leq 1$) and an n-type cladding layer 4 composed of an n-type $(Al_zGa_{1-z})_yIn_{1-y}P$ alloy (where, $x < z \leq 1$). In the light emitting device 100 shown in FIG. 1, the n-type AlGaInP cladding layer 4 is disposed on the first main surface side (top in the drawing) and the p-type AlGaInP cladding layer 6 is disposed on the second main surface side (bottom in the drawing). It is to be noted that "non-doped" in the context herein means "not intentionally added with a dopant", and never excludes possibility of any dopant components inevitably included through the normal fabrication process (up to $1 \times 10^{13}$ to $1 \times 10^{16}/cm^3$ or around, for example). The light emitting layer portion 24 is grown by the MOVPE method.

The thicknesses of the n-type cladding layer 4 and the p-type cladding layer 6 respectively fall in a typical range from 0.8 μm to 4 μm, both ends inclusive (preferably from 0.8 μm to 2 μm, both ends inclusive), and the thickness of an active layer 5 falls in a typical range from 0.4 μm to 2 μm, both ends inclusive (preferably from 0.4 μm to 1 μm, both ends inclusive). The total thickness of the light emitting layer portion 24 falls in a typical range from 2 μm to 10 μm (preferably from 2 μm to 5 μm, both ends inclusive).

The transparent thick-film semiconductor layer 90 serves not only as a supporting substrate for the thin light emitting layer portion 24, but also as an extraction layer for the emission flux from the light emitting layer portion 24, and can play a role of increasing the flux extractable from the side faces of the layer, and enhancing the luminance (integrating sphere luminance) of the entire device, if it is formed to as thick as 10 μm to 200 μm, both ends inclusive (preferably 40 μm to 100 μm, both ends inclusive). By composing the transparent thick-film semiconductor layer 90 using a III-V compound semiconductor having a band gap energy larger than a light quantum energy equivalent to a peak wavelength of emission flux from the light emitting layer portion 24, more specifically using GaP, GaAsP or AlGaAs, it is also made possible to suppress light absorption in the transparent thick-film semiconductor layer 90. The transparent thick-film semiconductor layer 90 is grown by the HVPE method (GaP and GaAsP are particularly suitable for production by the HVPE method), and the H concentration thereof can be set smaller than the H concentration of the p-type cladding layer 6 grown by the MOVPE method (generally $15 \times 10^{17}/cm^3$ or around). The transparent thick-film semiconductor layer 90 in this embodiment is p-type, and the light emitting layer portion 24 stacked thereon has the p-type cladding layer 6, the active layer 5 and the n-type cladding layer 4 stacked in this order from the p-type transparent thick-film semiconductor layer 90 side. It is, however, allowable to provide the transparent thick-film semiconductor layer 90 as an n-type layer, and to invert the order of stacking of the light emitting layer portion 24.

Between the transparent thick-film semiconductor layer 90 composed of a GaP (GaAsP or AlGaAs also allowable) layer and the light emitting layer portion 24, there is formed, by the MOVPE method, a connection layer 92 after forming the light emitting layer portion 24. The connection layer 92 may be composed of an AlGaInP layer gradually varying difference in the lattice constants (and consequently alloy composition) between the light emitting layer portion 24 composed of AlGaInP and the transparent thick-film semiconductor layer 90 composed of a GaP (GaASP or AlGaAs also allowable) layer.

Next, on the first main surface side of the light emitting layer portion 24, there is formed a current spreading layer 91 composed of AlGaAs or AlGaInP by the MOVPE method, to a thickness smaller than that of the transparent thick-film semiconductor layer 90. In other words, the current spreading layer 91 serves as a layer to form the main light extraction surface on the first main surface side of the light emitting layer portion 24, and a light-extraction-surface-side metal electrode 9 is formed so as to cover a part of the main light extraction surface. It can therefore be understood that the transparent thick-film semiconductor layer 90 is formed only on the second main surface side of the light emitting layer portion 24. To the light-extraction-surface-side metal electrode 9, one end of an electrode wire 17 is connected. The current spreading layer 91 is preferably adjusted to have an effective carrier concentration (that is, n-type dopant concentration) larger than that of the cladding layer 4, and the thickness thereof is typically adjusted to 0.5 μm to 30 μm, both ends inclusive (more preferably 1 μm to 15 μm, both ends inclusive). It is also allowable to omit the current spreading layer 91, and instead to adopt a structure in which the cladding layer 4 is thickened. In this case, it may be considered that the cladding layer 4 was thickened, or that another current spreading layer composed of AlGaInP, similarly to the cladding layer 4, was formed while leaving the thickness of the cladding layer 4 unchanged. The cladding layer 4 in this case preferably has the effective carrier concentration (that is, n-type dopant concentration), in the surficial portion thereof on the light-extraction-surface-side metal electrode 9 side, adjusted higher than that in the residual portion.

The entire portion of the second main surface of the transparent thick-film semiconductor layer 90 is covered with a back electrode 15 composed of an Au electrode or the like. The back electrode 15 serves also as a reflection layer for the emission flux coming from the light emitting layer portion 24 through the transparent thick-film semiconductor layer 90, and therefore contributes to improvement in the light extraction efficiency. Between the back electrode 15 and the transparent thick-film semiconductor layer 90, there is distributively formed a bonding alloyed layer 15c composed of an AuBe alloy or the like, according to a dot pattern. The bonding alloyed layer 15c is lowered in the reflectivity to some degree, due to alloying with the compound semiconductor layer composing the transparent thick-film semiconductor layer 90, so that the bonding alloyed layer 15c is distributively formed according to such dot pattern, and the background region thereof is composed as a direct reflection surface for the high-reflectivity back electrode 15. Between the light-extraction-surface-side metal electrode 9 and the current spreading layer 91, there is formed a bonding alloyed layer 9a composed of an AuGeNi alloy or the like.

In the above-described device configuration, the thickness of the current spreading layer 91 disposed on the main light extraction surface side is relatively small, so that it is preferable, in view of further raising the in-plane current spreading effect of the current spreading layer 91, to increase the concentration of dopant (majority carrier source) of the current spreading layer 91 so as to be higher than the dopant concentration of the transparent thick-film semiconductor layer 90 (for example, to as high as $2 \times 10^{18}/cm^3$ to $5 \times 10^{19}/cm^3$, both ends inclusive).

On the other hand, the thickness of the transparent thick-film semiconductor layer 90 is satisfied, so that a sheet resistance value can be easily obtained with no adverse affect the emission operation, without elevating the dopant concentration to a considerable degree. As described later, the overall dopant concentration of the transparent thick-film semiconductor layer 90 is also adjusted to a level relatively as low as $5 \times 10^{16}/cm^3$ to $2 \times 10^{18}/cm^3$, both ends inclusive, so that the chemical etching will be successful in removing the process-damaged layer possibly produced on the side face portion 90S, when using the device chips individualized by wafer dicing. In other words, the entire portion of the transparent thick-film semiconductor layer 90 is configured as a doping-controlled region.

The paragraphs below will explain a method of fabricating the light emitting device 100 shown in FIG. 1.

First, as shown in Step 1 in FIG. 2, an n-type GaAs single crystal substrate 1 as a growth substrate is prepared. Next, as shown Step 2 in FIG. 2, an n-type GaAs buffer layer 2 of typically 0.5 μm thick, and an n-type AlGaAs current spreading layer 91 of typically 5 μm thick are epitaxially grown on one main surface of the substrate 1.

Next, as the light emitting layer portion 24, the n-type cladding layer 4 of 1 μm thick (n-type dopant is Si), the active layer (non-doped) of 0.6 μm thick, and the p-type cladding layer 6 of 1 μm thick (p-type dopant is Mg: also C derived from organo-metallic molecules can be contributive as a p-type dopant), respectively composed of $(Al_xGa_{1-x})_yIn_{1-y}P$ alloy are epitaxially grown in this order. The dopant concentrations of the p-type cladding layer 6 and the n-type cladding layer 4 typically fall in the range from $1 \times 10^{17}/cm^3$ to $2 \times 10^{18}/cm^3$, both ends inclusive. Further on the p-type cladding layer 6, the connection layer 92 is epitaxially grown as shown in Step 3 of FIG. 3. It is to be understood herein that the main surface on the side facing to the substrate 10f the light emitting layer portion 24 is defined as the first main surface.

The above-described individual layers are epitaxial grown by any publicly-known MOVPE method. Source gases available as sources of the individual components Al, Ga, In (indium) and P (phosphorus) include the followings:

Al source gas; trimethyl aluminum (TMAl), triethyl aluminum (TEAl), etc.;

Ga source gas; trimethyl gallium (TMGa), triethyl gallium (TEGa), etc.;

In source gas; trimethyl indium (TMIn), triethyl indium (TEIn), etc.; and

P source gas; trimethyl phosphorus (TMP), triethyl phosphorus (TEP), phosphine ($PH_3$), etc.

The process then advances to Step 4 in FIG. 3, wherein the transparent thick-film semiconductor layer 90 composed of a p-type GaP (GaAsP also allowable) is grown by the HVPE method. The HVPE method is specifically proceeded so that Ga as a Group III element is heated and kept at a predetermined temperature in a vessel, and hydrogen chloride is introduced over Ga to thereby produce GaCl through a reaction expressed by the formula (1) below, and is then supplied over the substrate together with $H_2$ gas as a carrier gas:

$$Ga(l) + HCl(g) \rightarrow GaCl(g) + \tfrac{1}{2}H_2 \tag{1}$$

As for GaP, the growth temperature is typically set to 640° C. to 860° C., both ends inclusive, wherein P as a Group V element is supplied on the substrate in a form of $PH_3$, together with $H_2$ as a carrier gas. Zn as a p-type dopant is supplied in a form of DMZn (dimethyl Zn). GaCl is excellent in reactivity with $PH_3$, and can effectively grow the transparent thick-film semiconductor layer 90 according to the reaction expressed by the formula (2) below:

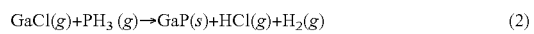
$$GaCl(g) + PH_3(g) \rightarrow GaP(s) + HCl(g) + H_2(g) \tag{2}$$

On the other hand, for the case where GaAsP ($GaAs_{1-a}P_a$: $0.5 \leq a \leq 0.9$) is adopted, $AsH_3$ is used together with $PH_3$ in the formula (2) in the above, and the growth temperature is set slightly as low as 770° C. to 830° C. This is advantageous in more effectively suppressing an undesirable lowering in the emission performance, due to excessive diffusion of the dopant towards the light emitting layer portion 24 when the transparent thick-film semiconductor layer 90 is grown by the HVPE method, or due to deterioration of a dopant profile of the light emitting layer portion 24 induced by thermal diffusion (for example, diffusion of the dopant contained in the cladding layers 6, 4 of the light emitting layer portion 24 into the active layer 5).

After completion of the growth of the transparent thick-film semiconductor layer 90, the process advances to Step 5 shown in FIG. 4, where the GaAs substrate 1 (and the buffer layer 2) is removed by chemical etching using an etching solution such as an ammonia/hydrogen peroxide mixed solution, to thereby obtain a wafer having the current spreading layer 91 disposed thereon. After completion of the above-described process steps, metal layers for forming the bonding alloyed layer are formed respectively on the first main surface of the current spreading layer 91 and on the second main surface of the transparent thick-film semiconductor layer 90, by sputtering or vacuum deposition methods, as shown in Step 6, and then annealed for alloying (so-called sintering) so as to form the bonding alloyed layers 9a, 15c. The light-extraction-surface-side electrode 9 and the back electrode 15 are formed so as to cover the bonding alloyed layers 9a and 15c, respectively. The wafer having the electrodes formed thereon is then divided by dicing into the individual device chips.

Figure 5:
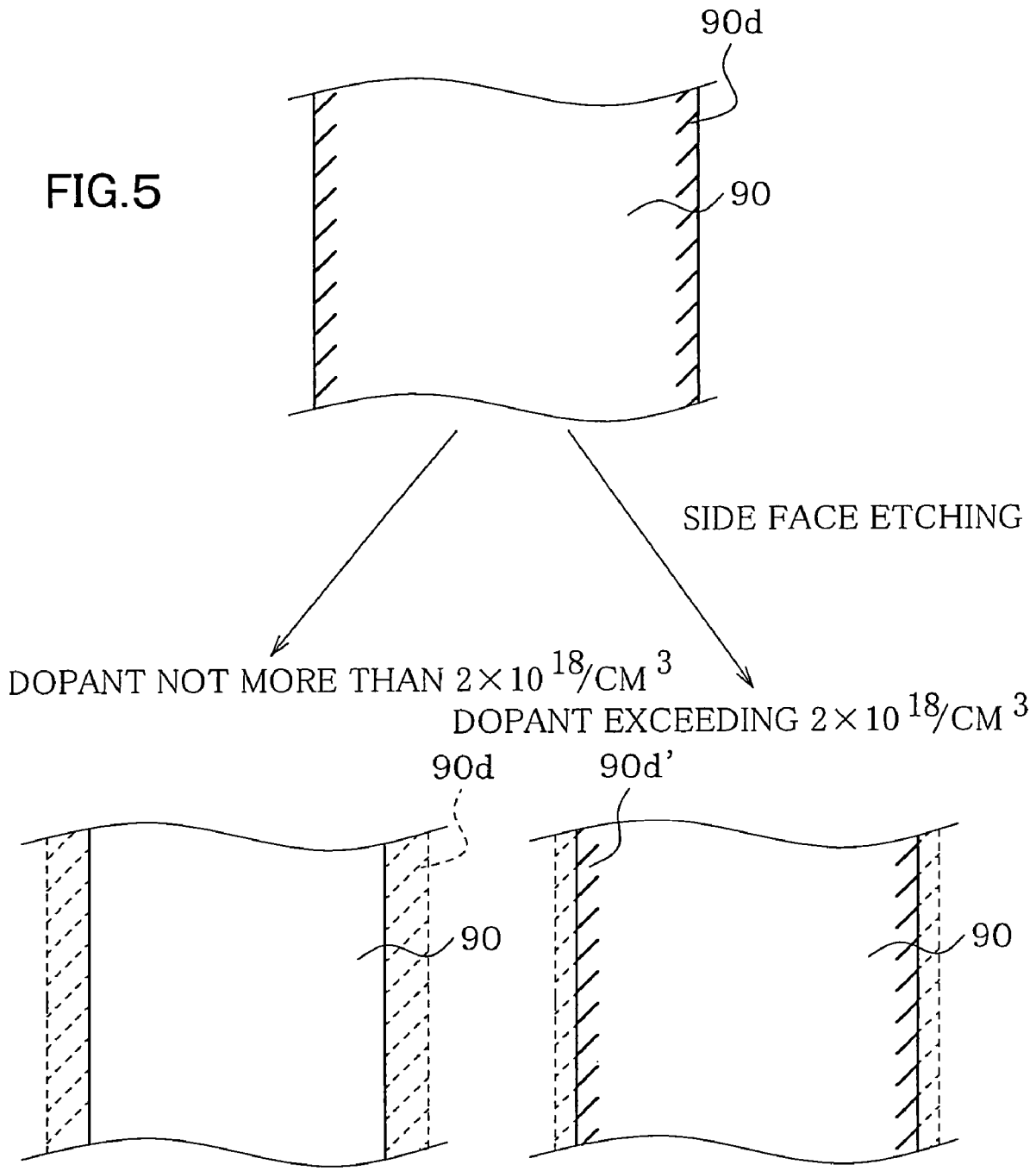
FIG. 5 is a drawing explaining states of removal of process-damaged layer on the side faces of the transparent thick-film semiconductor layer by chemical etching, variable depending on the dopant concentration of the transparent thick-film semiconductor layer.

In the process of dicing, process-damaged layers 90d with a predetermined thickness are formed on the side face portions of the transparent thick-film semiconductor layer 90 as shown on the lower left of FIG. 5. A large number of crystal defects contained in the process-damaged layers 90d are causative of current leakage and scattering under current supply for light emission, so that the process-damaged layers 90d are then removed by chemical etching. As an etchant, an aqueous sulfuric acid/hydrogen peroxide solution is used. A solution based on a mixing ratio by weight of (sulfuric acid):(hydrogen peroxide):water=20:1:1, for example, can be used as the aqueous solution, and the temperature of the solution is adjusted to 30° C. to 60° C., both ends inclusive.

Flux extractable from the side face portions 90S of the transparent thick-film semiconductor layer 90 would considerably be decreased, unless the process-damaged layers 90 composing the side faces are removed. More specifically, when the transparent thick-film semiconductor layer is simply thickened, extractable light from the side faces thereof is interfered by the process-damaged layer 90d, despite increase in the area of the side faces, so that increase in the integrating sphere luminance of the device in relation to the thickness reaches a plateau at a level only as small as 20 μm or around, as indicated by the broken line in FIG. 6. In other words, thickening of the transparent thick-film semiconductor layer 90 gives almost no merit. This tendency remains almost unchanged even if the dopant concentration of the transparent thick-film semiconductor layer 90 varies.

On the other hand, the chemical etching can remove the process-damaged layers 90d which interfere the light extraction, so that it was expected that the light extraction from the side faces would be enhanced, and that a larger thickness of the transparent thick-film semiconductor layer 90 would result in a larger integrating sphere luminance. However, it was found, as indicated by the dashed line in FIG. 6, that increase in the integrating sphere luminance with increase in the thickness was not so large against our expectation, when the transparent thick-film semiconductor layer 90 was added with a dopant to an amount exceeding $2\times10^{18}/cm^3$.

Figure 6:
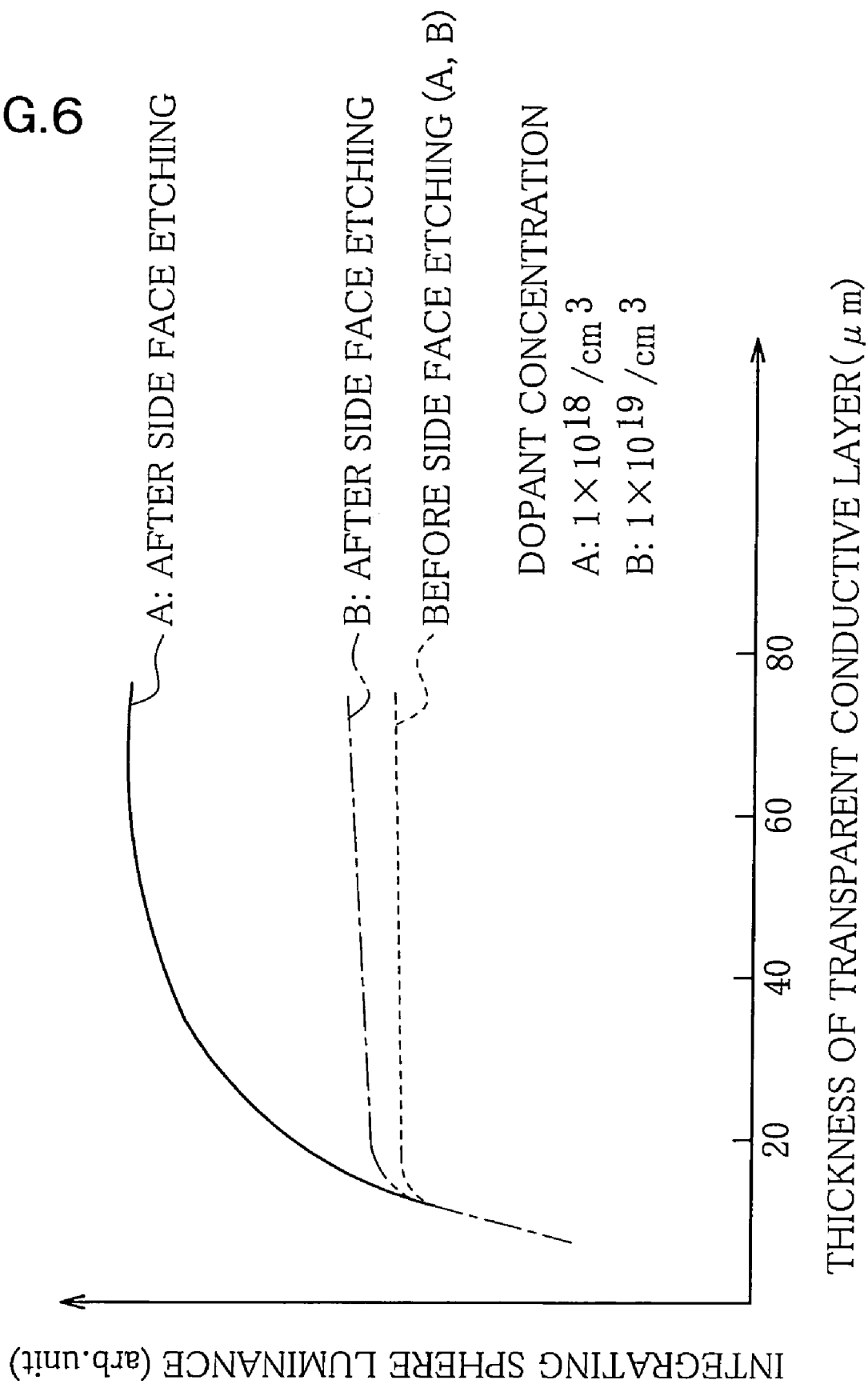
FIG. 6 is a graph showing how the integrating sphere luminance of the device varies before and after removal of the process-damaged layer depending on the thickness and the dopant concentration of the transparent thick-film semiconductor layer.

This is supposedly because it became difficult to fully remove the process-damaged layer 90d as shown in the lower right of FIG. 5, so that the residual process-damaged layer 90d' interferes the light extraction, and this made it impossible to obtain an effect of improving the luminance reasonably expected from the thickness of the transparent thick-film semiconductor layer 90 (FIG. 6 exemplifies the case with a dopant concentration of $1\times10^{19}/cm^3$). The damaged layer 90d can, however, smoothly and thoroughly be removed, by suppressing the dopant concentration of the transparent thick-film semiconductor layer 90 as small as $1\times10^{18}/cm^3$ or less. This consequently enhances the effect of improving the light extraction from the side faces when the thickness of the transparent thick-film semiconductor layer 90 is increased, thereby the integrating sphere luminance after the etching is dramatically increased as indicated by the solid line in FIG. 6 (which exemplifies the case with a dopant concentration of $1\times10^{18}/cm^3$), in particular in the range of the thickness of 40 μm or more, the integrating sphere luminance can be increased by a factor of 1.5 to nearly 2 over the case without chemical etching.

Figure 7:
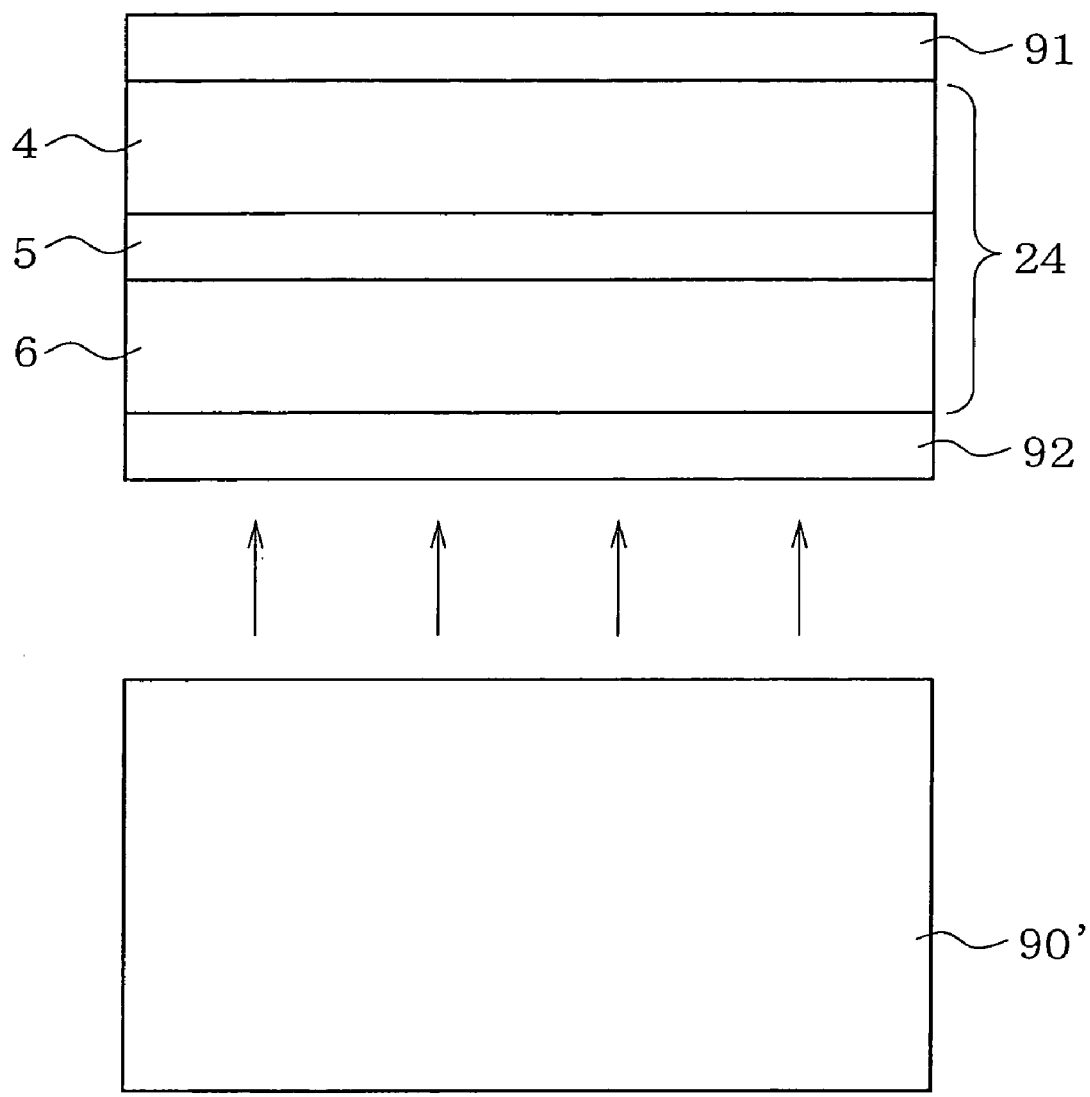
FIG. 7 is a schematic drawing showing an exemplary process of forming the transparent thick-film semiconductor layer by bonding of a single crystal substrate.

Paragraphs below will explain various modified examples of the light emitting device of this invention (any constituents commonly found in the light emitting device 10 in FIG. 1 are given with the same reference numerals so as to omit detailed explanation, allowing explanations only on different aspects). First as shown in FIG. 7, it is also allowable to separately obtain a GaP or GaAsP single crystal substrate 90' as the transparent thick-film semiconductor layer 90, and to bond it to the light emitting layer portion 24. For the case where the light emitting layer portion 24 is composed of AlGaInP, the single crystal substrate 90' composed of GaP (GaAsP also allowable) can directly be bonded by stacking it on the bonding surface side of the light emitting layer portion 24 under pressure, and then by annealing the stack in this state at a temperature from 100° C. to 700° C., both ends inclusive.

Figure 8:
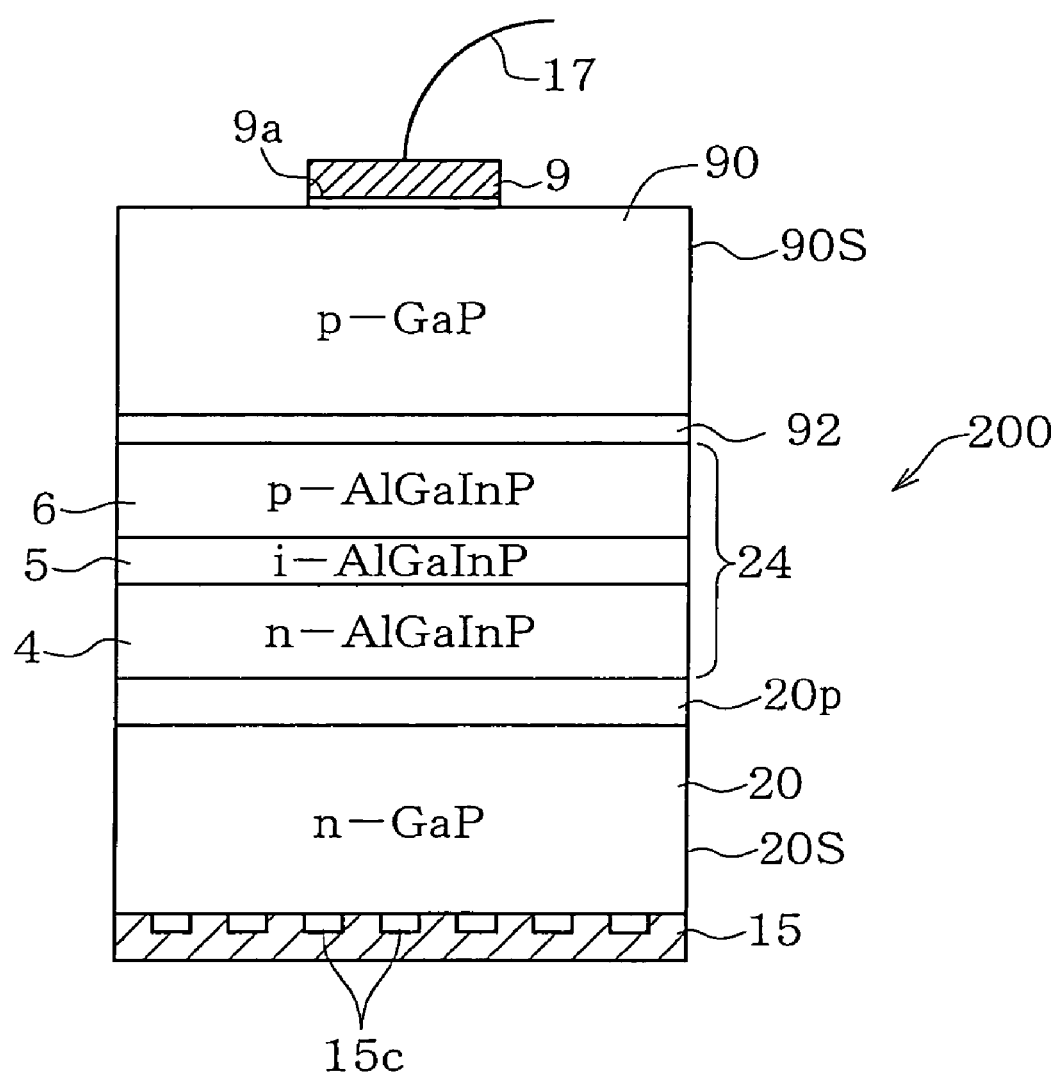
FIG. 8 is a sectional view showing an exemplary light emitting device having the first and the second transparent thick-film semiconductor layers formed on both main surfaces of the light emitting layer portion.

It is also allowable, as in a light emitting device 200 shown in FIG. 8, to dispose the transparent thick-film semiconductor layer 90 on the first main surface side of the light emitting layer portion 24, while considering the first main surface of the transparent thick-film semiconductor layer 90 as the light extraction surface, and to dispose the light-extraction-surface-side metal electrode 9 so as to cover a part thereof. In this configuration, the transparent thick-film semiconductor layer 90 can considerably increase the current spreading effect on the main light extraction surface side. In the light emitting device 200 of this embodiment, the first transparent thick-film semiconductor layer 90 composed of p-type GaP (GaAsP or AlGaAs also allowable) is epitaxially grown by the HVPE method on the first main surface side of the light emitting layer portion 24 (reference numeral 92 represents a bonding layer formed by the MOVPE method, similar to that indicated by reference numeral 92 in FIG. 1). The stack order of the individual layers 4 to 6 of the light emitting layer portion 24 from the main light extraction surface side is inverted from that in FIG. 1, and the bonding alloyed layer 9a composed of an AuBe alloy is disposed between the light-extraction-surface-side metal electrode 9 and the first transparent thick-film semiconductor layer 90. On the second main surface side of the light emitting layer portion 24, there is formed a second transparent thick-film semiconductor layer 20 composed of n-type GaP (GaAsP or AlGaAs also allowable) by bonding of a single crystal semiconductor substrate. On the second main surface of the second transparent thick-film semiconductor layer 20, there is distributively formed a bonding alloyed layer 15c composed of an AuGeNi alloy according to a dot pattern, as being covered with the back electrode 15. Both of the first transparent thick-film semiconductor layer 90 and the second transparent thick-film semiconductor layer 20 are respectively adjusted to have a dopant concentration of $5\times10^{16}/cm^3$ to $2\times10^{18}/cm^3$, and the side faces 90S and 20S are respectively given as the chemically-etched surfaces from which the process-damaged layers caused by dicing have been removed. The light emitting layer portion 24 is formed by epitaxial growth on the second main surface side (n-type cladding layer 4 side in this case) of the GaAs substrate, wherein it is allowable to remove, by etching, the GaAs substrate from the second main surface side of the light emitting layer portion 24, and to bond the second transparent thick-film semiconductor layer 20 onto the second main surface side (second main surface of the bonding layer 20p in this case). It is, however, to be noted that the second transparent thick-film semiconductor layer 20 may epitaxially be grown by the HVPE method.

Figure 9:
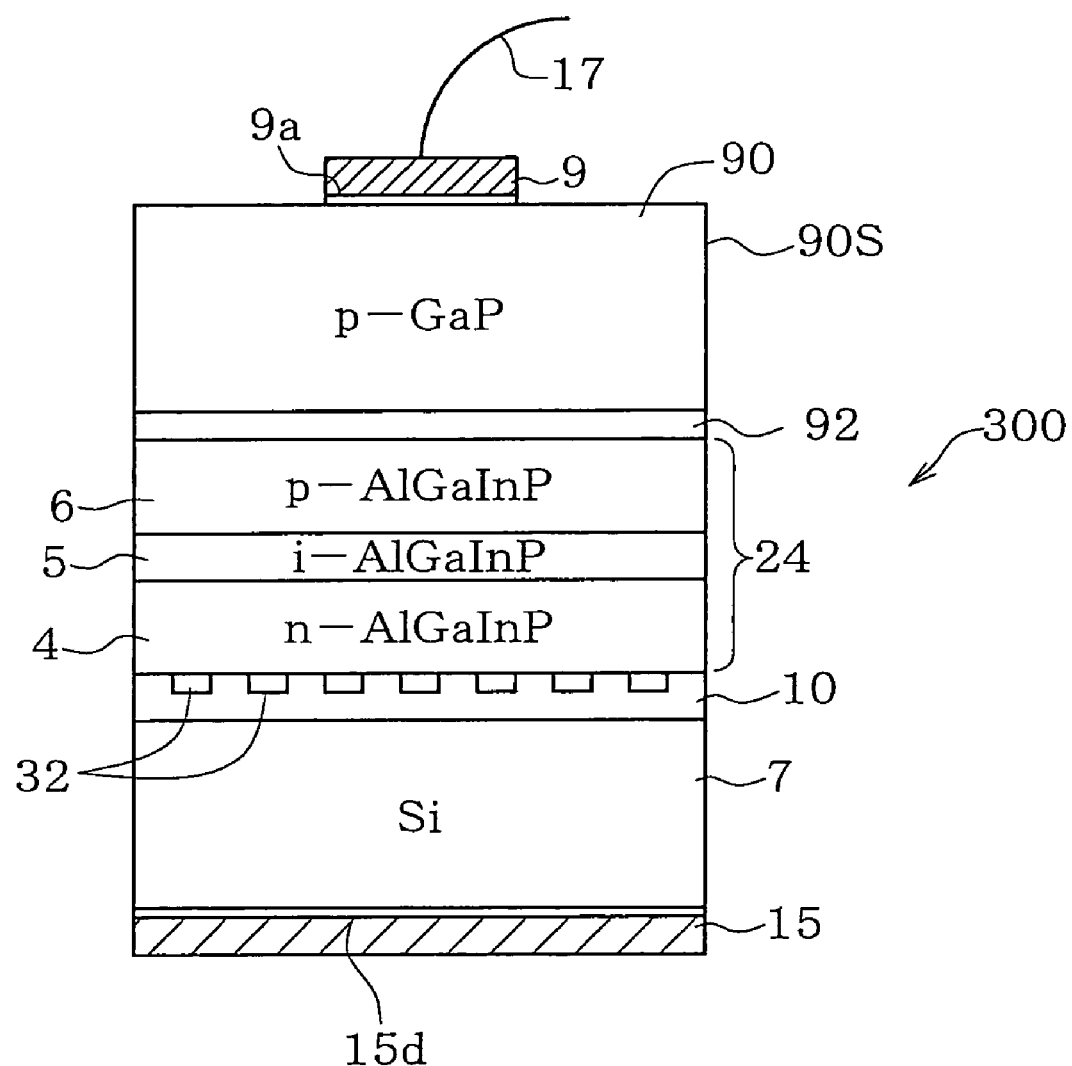
FIG. 9 is a sectional view showing an exemplary light emitting device having the transparent thick-film semiconductor layer provided on the main light extraction surface side, and having the metal layer provided on the opposite side.

A light emitting device 300 shown in FIG. 9 is configured as having a metal reflective layer 10 composed of Au or Ag (or alloy containing any of these elements as a major component), in place of bonding the second transparent thick-film semiconductor layer 20 on the second main surface side of the light emitting layer portion 24 as in the light emitting device 200 shown in FIG. 8. Now the emission flux from the light emitting layer portion 24 is reflected by the metal reflective layer 10 back to the main light extraction surface side, realizing a light emitting device excellent in directionality on the main light extraction surface side. In this embodiment, a conductive Si substrate 7 is bonded onto the second main surface of the light emitting layer portion 24 through the metal reflective layer 10. The back electrode 15 formed on the second main surface of the Si substrate 7 does not form a reflective surface, so that a bonding metal layer 15d is formed over the entire portion of the second main surface of the Si substrate 7. Between the metal reflective layer 10 and the light emitting layer portion 24, there is distributively formed a bonding alloyed layer 32 (typically composed of an AuGeNi alloy) according to a dot pattern.

In both of the light emitting devices 200 and 300 shown in FIG. 8 and FIG. 9, the transparent thick-film semiconductor layer 90 on the main light extraction surface side may be formed by bonding a single crystal substrate, rather than configuring it as a layer epitaxially grown by the HVPE method.

In the light emitting devices 100, 200 and 300 shown in FIG. 1, FIG. 8 and FIG. 9, it is also allowable to replace the back electrode 15 with an Ag paste layer. In addition, the active layer 5 of the light emitting layer portion 24, which was formed as a single layer in the above, as having a quantum well structure in which a plurality of compound semiconductor layers differing from each other in the band gap energy are stacked.

The transparent thick-film semiconductor layers 90 (20) in all of the above embodiments were formed as the doping-controlled regions over the entire portions thereof, as having the dopant concentration controlled to the range from $5\times10^{16}/cm^3$ to $2\times10^{18}/cm^3$ both ends inclusive, whereas it is also allowable to configure a region corresponded to a part of the thickness (preferably 50% or less of the total thickness) of the transparent thick-film semiconductor layers 90 (20) as a layer region having a dopant concentration exceeding $2\times10^{18}/cm^3$. For example in the light emitting device 100 shown in FIG. 1, contact resistance of the back electrode 15 can further be lowered, by raising the dopant concentration of the region of the transparent thick-film semiconductor layer 90 in contact with the back electrode 15 to a level exceeding $2\times10^{18}/cm^3$.

What is claimed is:

1. A light emitting device comprising:
    a light emitting layer portion composed of a III-V compound semiconductor; and
    a transparent thick-film semiconductor layer having a thickness of 10 μm or more, formed on at least one main surface of the light emitting layer portion, and composed of a III-V compound semiconductor having a band gap energy larger than a light quantum energy equivalent to a peak wavelength of emission flux from the light emitting layer portion,
    the transparent thick-film semiconductor layer has the side face portions configured as chemically-etched surfaces, and has a doping-controlled region having a controlled dopant concentration of $5\times10^{16}/cm^3$ to $2\times10^{18}/cm^3$, both ends inclusive, formed therein to a thickness of 10 μm or more.

2. The light emitting device as claimed in claim 1, wherein the thickness of the transparent thick-film semiconductor layer is 40 μm or more, and the thickness of the doping-controlled layer in the transparent thick-film semiconductor layer is 40 μm or more.

3. The light emitting device as claimed in claim 2, wherein the light emitting layer portion, considered as having one of two main surfaces thereof as a first main surface, has a main light extraction surface formed on the first main surface side thereof, a light-extraction-surface-side metal electrode is disposed on the main light extraction surface so as to cover a part of thereof, and on the other hand, the transparent thick-film semiconductor layer is provided only on the second main surface side of the light emitting layer portion.

4. The light emitting device as claimed in claim 2, wherein the transparent thick-film semiconductor layer is disposed on the first main surface side of the light emitting layer portion, and assuming the first main surface of the transparent-thick-film semiconductor layer as the main light extraction surface, the light-extraction-surface-side metal electrode is disposed so as to cover a part thereof.

5. The light emitting device as claimed in claim 4, wherein a metal reflective layer is disposed on the second main surface side of the light emitting layer portion.

6. The light emitting device as claimed in claim 4, wherein a first transparent thick-film semiconductor layer is provided on the first main surface side of the light emitting layer portion, and a second transparent thick-film semiconductor layer on the second main surface side thereof, respectively as the transparent thick-film semiconductor layer.

7. The light emitting device as claimed in claim 2, wherein the light emitting layer portion has a double heterostructure composed of AlGaInP, and the transparent thick-film semiconductor layer is composed of any one of GaP, GaAsP and AlGaAs.

8. The light emitting device as claimed in claim 2, wherein the transparent thick-film semiconductor layer is a single-crystal substrate composed of a III-V compound semiconductor, bonded to the light emitting layer portion.

9. The light emitting device as claimed in claim 1, wherein the light emitting layer portion, considered as having one of two main surfaces thereof as a first main surface, has a main light extraction surface formed on the first main surface side thereof, a light-extraction-surface-side metal electrode is disposed on the main light extraction surface so as to cover a part of thereof, and on the other hand, the transparent thick-film semiconductor layer is provided only on the second main surface side of the light emitting layer portion.

10. The light emitting device as claimed in claim 1, wherein the transparent thick-film semiconductor layer is disposed on the first main surface side of the light emitting layer portion, and assuming the first main surface of the transparent-thick-film semiconductor layer as the main light extraction surface, the light-extraction-surface-side metal electrode is disposed so as to cover a part thereof.

11. The light emitting device as claimed in claim 10, wherein a metal reflective layer is disposed on the second main surface side of the light emitting layer portion.

12. The light emitting device as claimed in claim 10, wherein a first transparent thick-film semiconductor layer is provided on the first main surface side of the light emitting layer portion, and a second transparent thick-film semiconductor layer on the second main surface side thereof, respectively as the transparent thick-film semiconductor layer.

13. The light emitting device as claimed in claim 1, wherein the light emitting layer portion has a double heterostructure composed of AlGaInP, and the transparent thick-film semiconductor layer is composed of any one of GaP, GaAsP and AlGaAs.

14. The light emitting device as claimed in claim 1, wherein the transparent thick-film semiconductor layer is a single-crystal substrate composed of a III-V compound semiconductor, bonded to the light emitting layer portion.

15. A method of fabricating a light emitting device comprising:
    fabricating a wafer which comprises a light emitting layer portion composed of a III-V compound semiconductor; and a transparent thick-film semiconductor layer having a thickness of 10 μm or more, formed on at least one main surface of the light emitting layer portion, and composed of a III-V compound semiconductor having a band gap energy larger than a light quantum energy equivalent to a peak wavelength of emission flux from the light emitting layer portion; and dicing the wafer to divide it into the individual device chips;

also forming, in the transparent thick-film semiconductor layer, a doping-controlled region having a controlled dopant concentration of $5\times10^{16}/cm^3$ to $2\times10^{18}/cm^3$, both ends inclusive, to a thickness of 10 µm or more, and removing a process-damaged layer, formed on the side face portions of the transparent thick-film semiconductor layer, by chemical etching after the dicing.

16. The method of fabricating a light emitting device as claimed in claim 15, wherein the transparent thick-film semiconductor layer is composed of any one of GaP, GaAsP and AlGaAs, and an aqueous sulfuric acid/hydrogen peroxide solution is used as an etchant of the chemical etching.

* * * * *